United States Patent
Wang (10) Patent No.: US 9,031,516 B2
(45) Date of Patent: May 12, 2015

(54) APPARATUS AND METHOD FOR IMPEDANCE ADJUSTMENT

(71) Applicant: Accton Technology Corporation, Hsinchu (TW)

(72) Inventor: Wen-Chi Wang, Taipei (TW)

(73) Assignee: Accton Technology Corporation, Hsinchu (TW)

( * ) Notice: Subject to any disclaimer, the term of this patent is extended or adjusted under 35 U.S.C. 154(b) by 28 days.

(21) Appl. No.: 13/957,933

(22) Filed: Aug. 2, 2013

(65) Prior Publication Data

US 2014/0295777 A1    Oct. 2, 2014

(30) Foreign Application Priority Data

Mar. 29, 2013  (TW) .............................. 102111371 A (51) Int. Cl.
  *H04B 1/40* (2006.01)
  *H03H 7/38* (2006.01)
(52) U.S. Cl.
  CPC ... *H03H 7/38* (2013.01); *H04B 1/40* (2013.01)
(58) Field of Classification Search
  CPC .................................... H03H 7/38; H04B 1/40
  USPC ............ 455/75, 83, 193.2, 191.3, 115.3, 134, 455/226.2
  See application file for complete search history.

(56) References Cited

U.S. PATENT DOCUMENTS

| | | | |
|---|---|---|---|
| 7,068,107 B2 * | 6/2006 | Wang et al. | 330/282 |
| 7,327,188 B2 * | 2/2008 | Wang et al. | 330/10 |
| 7,495,593 B2 * | 2/2009 | Wang | 341/143 |
| 7,548,121 B2 * | 6/2009 | Wang et al. | 331/11 |
| 8,325,865 B1 * | 12/2012 | Rofougaran et al. | 375/350 |
| 8,447,255 B2 * | 5/2013 | Asokan | 455/273 |
| 8,467,738 B2 * | 6/2013 | Gorbachov | 455/73 |
| 8,644,197 B2 * | 2/2014 | Lee et al. | 370/275 |
| 8,867,661 B2 * | 10/2014 | Behzad | 375/296 |
| 2007/0207746 A1 * | 9/2007 | Huang et al. | 455/78 |
| 2010/0105425 A1 * | 4/2010 | Asokan | 455/552.1 |

FOREIGN PATENT DOCUMENTS

| | | |
|---|---|---|
| CN | 1220525 A | 6/1999 |
| CN | 1287460 A | 3/2001 |

* cited by examiner

*Primary Examiner* — Marceau Milord
(74) *Attorney, Agent, or Firm* — Birch, Stewart, Kolasch & Birch, LLP (57) ABSTRACT

A transceiver includes an antenna, an impedance adjustment device, an RF (Radio Frequency) front-end circuit, a storage device, and a processor. The antenna receives an RF signal. The impedance adjustment device is coupled to the antenna, and includes a plurality of branch circuit with different impedance values and a switch module. The processor is coupled to the RF front-end circuit and controls the switch modules. In a comparison mode, the switch module selects to connect to the branch circuits individually, and the processor detects each RSSI (Received Signal Strength Indications) value corresponding to the branch circuit and records all of the RSSI values to the storage device respectively. In the comparison mode, the processor further compares the RSSI values to for highest one. Finally, the switch module selects the branch circuit corresponding to the highest RSSI value as a transmission branch.

16 Claims, 6 Drawing Sheets

APPARATUS AND METHOD FOR IMPEDANCE ADJUSTMENT

CROSS REFERENCE TO RELATED APPLICATIONS

This Application claims priority of Taiwan Patent Application No. 102111371 filed on Mar. 29, 2013, the entirety of which is incorporated by reference herein.

BACKGROUND OF THE INVENTION

1. Field of the Invention

The disclosure generally relates to a transceiver, and more particularly, relates to a transceiver comprising an impedance adjustment device for maintaining optimal antenna efficiency.

2. Description of the Related Art

With the help of advanced mobile communication technology, mobile devices such as portable computers, mobile phones, tablet computers, multimedia players, and other hybrid functional portable electronic devices becomes more common. Mobile devices usually includes wireless communication function for satisfying the demands of users, Some mobile devices provide a long-distance wireless communication, for example, mobile phones using 2G, 3G, and LTE (Long Term Evolution) systems with frequency bands as 700 MHz, 850 MHz, 900 MHz, 1800 MHz, 1900 MHz, 2100 MHz, 2300 MHz, and 2500 MHz. Some mobile devices provide a short-distance wireless communication, for example, mobile phones using Wi-Fi, Bluetooth, and WiMAX (Worldwide Interoperability for Microwave Access) systems with frequency bands as 2.4 GHz, 3.5 GHz, 5.2 GHz, and 5.8 GHz.

An antenna for wireless communication is an essential component in a mobile device. Generally, the antenna should be worked in a clearance region without any conductive objects therearound. However, the mobile device usually contacts with user's hand or head in practice. If the antenna contacts with other media or the antenna is disposed adjacent to a conductive object, the impedance of the antenna will be changed and may cause signal weakness or huge power consumption accordingly.

BRIEF SUMMARY OF THE INVENTION

In one exemplary embodiment, the disclosure is directed to a transceiver, comprising: an antenna, receiving an RF (Radio Frequency) signal; an impedance adjustment device, coupled to the antenna, and comprising: a plurality of branch circuits, which have different impedance values; and a switch module, selecting one of the branch circuit as a transmission branch according to a control signal; an RF front-end circuit, receiving the RF signal through the transmission branch from the antenna and filtering and amplifying received RF signal; a storage device; and a processor, coupled to the RF front-end circuit, and generating the control signal, wherein in a comparison mode, the switch module selects to connect to the branch circuits individually, and the processor detects the RSSI (Received Signal Strength Indication) value corresponding to each of the branch circuits and records all of the RSSI values to the storage device respectively. The switch module compares all of the RSSI values and selects the branch circuit which corresponding to the highest RSSI value as the transmission branch.

In another exemplary embodiment, the disclosure is directed to an impedance adjustment device, comprising: a plurality of branch circuits, having different impedance values; and a switch module, selecting one of the branch circuits as a transmission branch according to a control signal, wherein the control signal is generated according to comparisons between the RSSI (Received Signal Strength Indication) value corresponding to all the branch circuits.

In one exemplary embodiment, the disclosure is directed to a method for impedance adjustment, comprising the steps of: (a) receiving an RF (Radio Frequency) signal by an antenna; (b) in a comparison mode, selecting to connect to a plurality of branch circuits in an impedance adjustment device individually, wherein the branch circuits have different impedance values, the selected branch circuit is used as a transmission branch, and the RF signal is transmitted through the transmission branch; (c) in the comparison mode, detecting the RSSI (Received Signal Strength Indication) value corresponding to each of the branch circuits respectively and comparing all of the RSSI values with each other; and (d) selecting the branch circuit corresponding to the highest RSSI as the transmission branch.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures thereof in the invention are described in detail as follows.

Figure 1:
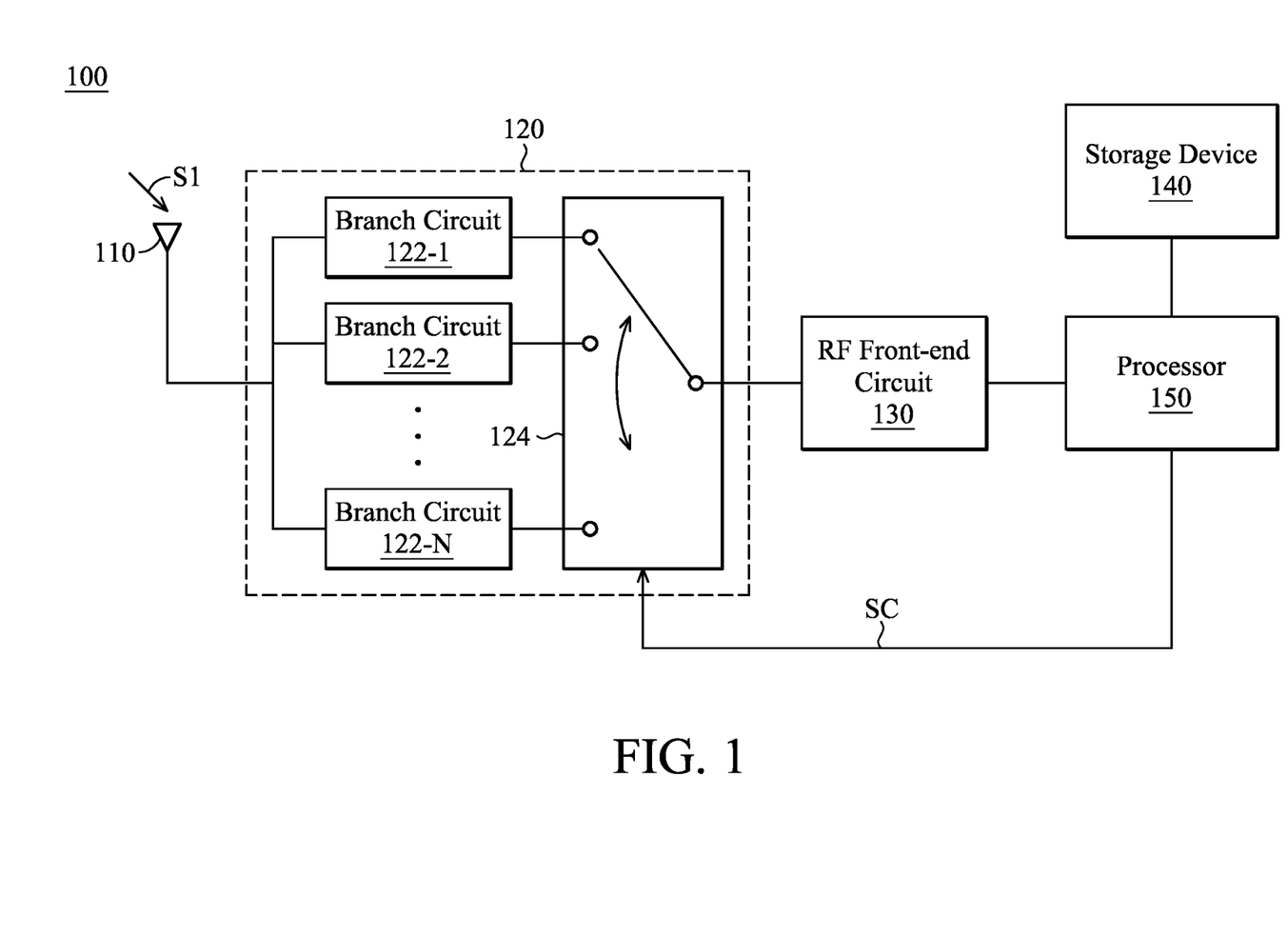
FIG. 1 is a diagram for illustrating a transceiver according to an embodiment of the invention.

FIG. 1 is a diagram for illustrating a transceiver 100 according to an embodiment of the invention. The transceiver 100 for wireless communication may be equipped in a mobile device, such as a smart phone, a tablet computer, or a notebook computer. As shown in FIG. 1, the transceiver 100 comprises an antenna 110, an impedance adjustment device 120, an RF (Radio Frequency) front-end circuit 130, a storage device 140, and a processor 150. It is noted that the transceiver 100 may further comprise other components, such as an oscillator, a PA (Power Amplifier), or an LNA (Low Noise Amplifier) (not shown in FIG. 1).

The antenna 110 is configured to receive (or transmit) an RF signal S1. Type of the antenna 110 is not limited in the invention. For example, the antenna 110 may be a monopole antenna, a dipole antenna, a loop antenna, a patch antenna, a PIFA (Planar Inverted F Antenna), or a chip antenna. The impedance adjustment device 120 is coupled to the antenna 110 and comprises a plurality of branch circuits 122-1, 122-2, ..., and 122-N (N is a positive integer which is greater than or equal to 2) and a switch module 124. The branch circuits 122-1, 122-2, ..., and 122-N have different impedance values. In some embodiments, each of the branch circuits 122-1, 122-2, ..., and 122-N comprises one or more circuit components, such as capacitors, inductors, and/or resistors. The switch module 124 selects one of the branch circuits 122-1, 122-2, ..., and 122-N as a transmission branch according to a control signal SC. It should be understood that the internal structure of the switch module 124 of FIG. 1 is just exemplary, and in fact the switch module 124 may be implemented with a variety of circuit components (e.g., a multiplexer or a control logic circuit). The RF front-end circuit 130 receives the RF signal S1 through the selected transmission branch from the antenna 110, and filters and amplifies the RF signal S1. In some embodiments, the RF front-end circuit 130 comprises a T/R (Transmission/Reception) switch, an LNA, a PA, and a plurality of filters (not shown in FIG. 1). The storage device 140 may be a memory device or a hard disk. In some embodiments, the storage device 140 is integrated with the processor 150 to form a single circuit. That is, the storage device 140 may be a portion of the processor 150.

The processor 150 is coupled to the switch module 124, the RF front-end circuit 130, and the storage device 140. The processor 150 generates the control signal SC for controlling the impedance adjustment device 120 and the switch module 124 therein. In a comparison mode, the switch module 124 selects to connect to the branch circuits 122-1, 122-2, ..., and 122-N one after another (e.g., sequential selection or random selection). Also in the comparison mode, the processor 150 detects the RSSI (Received Signal Strength Indication) values corresponding to the branch circuits 122-1, 122-2, ..., and 122-N, and then records all of the RSSI values to the storage device 140 respectively. Next, the processor 150 compares the RSSI values stored in the storage device 140 with each other for the highest one. Finally, the switch module 124 selects the branch circuit corresponding to the highest RSSI value as the transmission branch.

Following is an example for illustrating operations of the processor 150 and the impedance adjustment device 120. It is assumed that N is equal to 3, In the comparison mode, if the switch module 124 selects to connect to a branch circuit 122-1, the processor 150 may detect a first RSSI value measured as 10 units, and if the switch module 124 selects to connect to a branch circuit 122-2, the processor 150 may detect a second RSSI value measured as 40 units, and if the switch module 124 selects to connect to a branch circuit 122-3, the processor 150 may detect a third RSSI value measured as 20 units. For the example, since the branch circuit 122-2 corresponds to the highest RSSI value (40>20>10), the switch module 124 selects the branch circuit 122-2 as the transmission branch to maintain antenna efficiency optimized.

Figure 2:
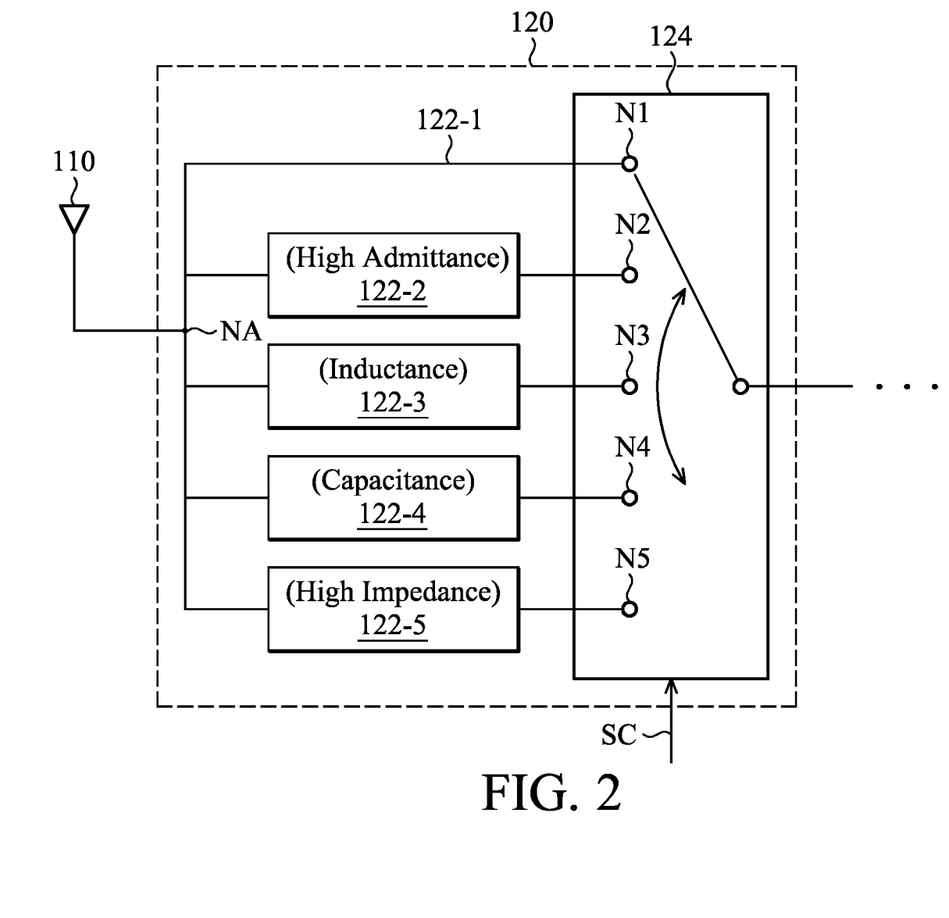
FIG. 2 is a diagram for illustrating an impedance adjustment device according to an embodiment of the invention.

FIG. 2 is a diagram for illustrating the impedance adjustment device 120 according to an embodiment of the invention. In the embodiment, the number of the branch circuits 122-1, 122-2, ..., and 122-N is equal to 5 (i.e., N is equal to 5). The branch circuit 122-1 coupled between the antenna 110 (or an antenna node NA) and the switch node N1 is a short-circuited path. In the comparison mode, the branch circuit 122-1 may be selected first. The branch circuit 122-2 coupled between the antenna 110 and the switch node N2 is characterized by high admittance. The branch circuit 122-3 coupled between the antenna 110 and the switch node N3 characterized by inductance. The branch circuit 122-4 coupled between the antenna 110 and the switch node N4 characterized by capacitance. The branch circuit 122-5 coupled between the antenna 110 and the switch node N5 characterized by high impedance. The switch module 124 switches between the switch nodes N1, N2, N3, N4, and N5 according to the control signal SC so as to select one of the branch circuits 122-1, 122-2, 122-3, 122-4, and 122-5. Once the antenna 110 of the transceiver 100 gets close to a conductive object (e.g., a human body or a metal material), the impedance of the antenna 110 will be changed, and radiation performance (signal strength) of the antenna 110 will become weak. In the invention, by switching between a plurality of branch circuits with different impedance values, the impedance matching of the antenna 110 is retuned to maintain optimal antenna efficiency. For example, if the current impedance characteristic of the antenna 110 corresponds to the high inductance region of the Smith Chart, the switch module 124 can select the branch circuit 122-4 having the capacitance characteristic to improve the impedance matching thereof. The branch circuits 122-1, 122-2, 122-3, 122-4, and 122-5 may be implemented with a variety of circuits. Refer to the following embodiments.

Figure 3A:
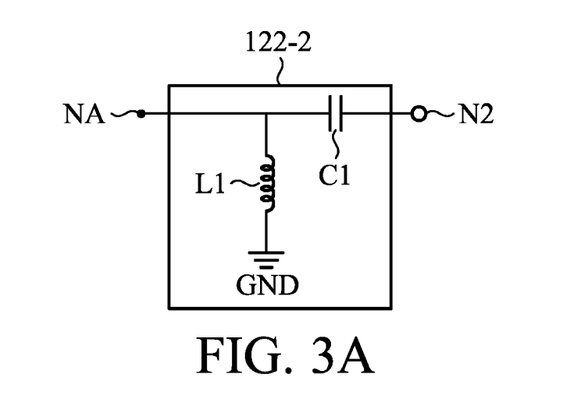
FIG. 3A is a diagram for illustrating a branch circuit according to an embodiment of the invention.

FIG. 3A is a diagram for illustrating the branch circuit 122-2 according to an embodiment of the invention. As shown in FIG. 3A, the branch circuit 122-2 comprises a capacitor C1 and an inductor L1. A first terminal of the capacitor C1 is coupled to the antenna 110, and a second terminal of the capacitor C1 is coupled to the switch node N2. A first terminal of the inductor L1 is coupled to the first terminal of the capacitor C1, and a second terminal of the inductor L1 is coupled to a ground node GND (e.g., 0V).

Figure 3B:
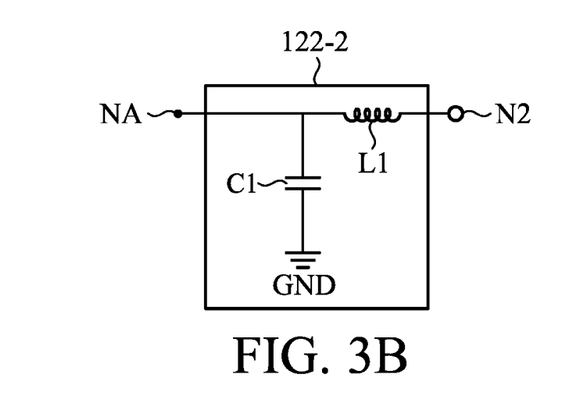
FIG. 3B is a diagram for illustrating a branch circuit according to another embodiment of the invention.

FIG. 3B is a diagram for illustrating the branch circuit 122-2 according to another embodiment of the invention. As shown in FIG. 3B, the branch circuit 122-2 comprises a capacitor C1 and an inductor L1. A first terminal of the inductor L1 is coupled to the antenna 110, and a second terminal of the inductor L1 is coupled to the switch node N2. A first terminal of the capacitor C1 is coupled to the first terminal of the inductor L1, and a second terminal of the capacitor C1 is coupled to the ground node GND.

Figure 4A:
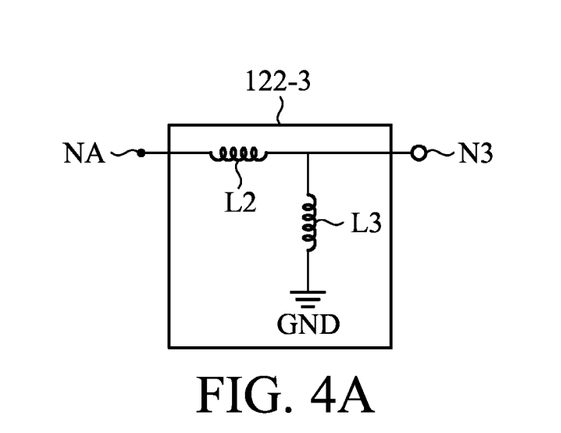
FIG. 4A is a diagram for illustrating a branch circuit according to an embodiment of the invention.

FIG. 4A is a diagram for illustrating the branch circuit 122-3 according to an embodiment of the invention. As shown in FIG. 4A, the branch circuit 122-3 comprises two inductors L2 and L3. A first terminal of the inductor L2 is coupled to the antenna 110, and a second terminal of the inductor L2 is coupled to the switch node N3. A first terminal of the inductor L3 is coupled to the second terminal of the inductor L2, and a second terminal of the inductor L3 is coupled to the ground node GND.

Figure 4B:
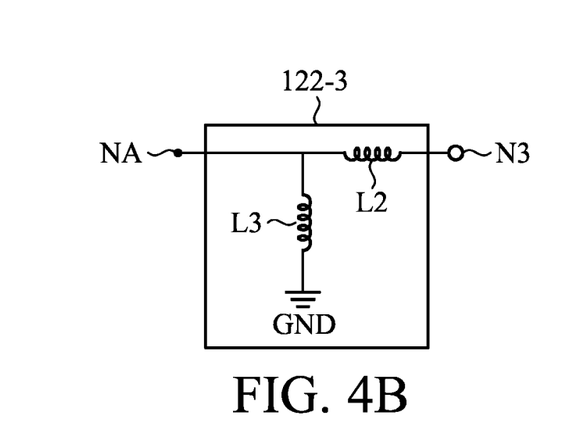
FIG. 4B is a diagram for illustrating a branch circuit according to another embodiment of the invention.

FIG. 4B is a diagram for illustrating the branch circuit 122-3 according to another embodiment of the invention. As shown in FIG. 4B, the branch circuit 122-3 comprises two inductors L2 and L3. A first terminal of the inductor L2 is coupled to the antenna 110, and a second terminal of the inductor L2 is coupled to the switch node N3. A first terminal of the inductor L3 is coupled to the first terminal of the inductor L2, and a second terminal of the inductor L3 is coupled to the ground node GND.

Figure 5A:
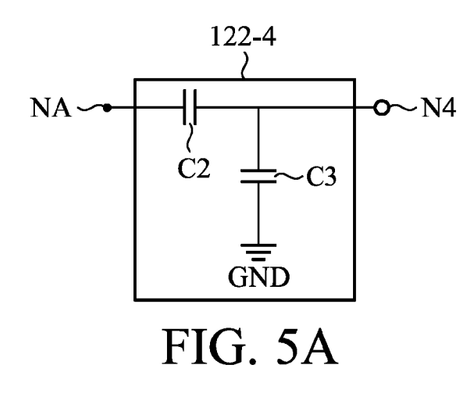
FIG. 5A is a diagram for illustrating a branch circuit according to an embodiment of the invention.

FIG. 5A is a diagram for illustrating the branch circuit 122-4 according to an embodiment of the invention. As shown in FIG. 5A, the branch circuit 122-4 comprises two capacitors C2 and C3. A first terminal of the capacitor C2 is coupled to the antenna 110, and a second terminal of the capacitor C2 is coupled to the switch node N4. A first terminal of the capacitor C3 is coupled to the second terminal of the capacitor C2, and a second terminal of the capacitor C3 is coupled to the ground node GND.

Figure 5B:
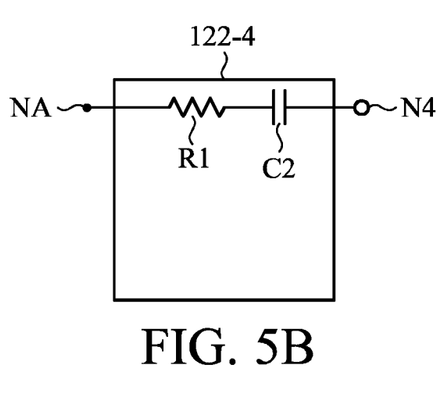
FIG. 5B is a diagram for illustrating a branch circuit according to another embodiment of the invention.

FIG. 5B is a diagram for illustrating the branch circuit 122-4 according to another embodiment of the invention. As shown in FIG. 5B, the branch circuit 122-4 comprises a capacitor C2 and a resistor R1. A first terminal of the resistor R1 is coupled to the antenna 110, and a second terminal of the resistor R1 is coupled to a first terminal of the capacitor C2. A second terminal of the capacitor C2 is coupled to the switch node N4.

Figure 6A:
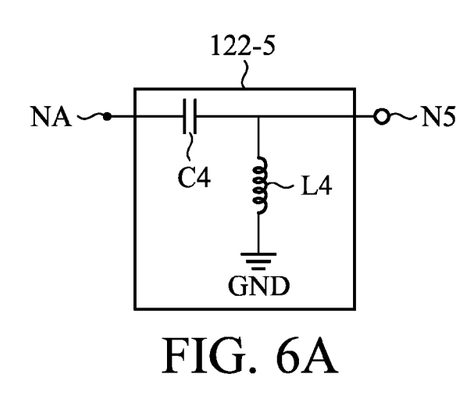
FIG. 6A is a diagram for illustrating a branch circuit according to an embodiment of the invention.

FIG. 6A is a diagram for illustrating the branch circuit 122-5 according to an embodiment of the invention. As shown in FIG. 6A, the branch circuit 122-5 comprises a capacitor C4 and an inductor L4. A first terminal of the capacitor C4 is coupled to the antenna 110, and a second terminal of the capacitor C4 is coupled to the switch node N5. A first terminal of the inductor L4 is coupled to the second terminal of the capacitor C4, and a second terminal of the inductor L4 is coupled to the ground node GND.

Figure 6B:
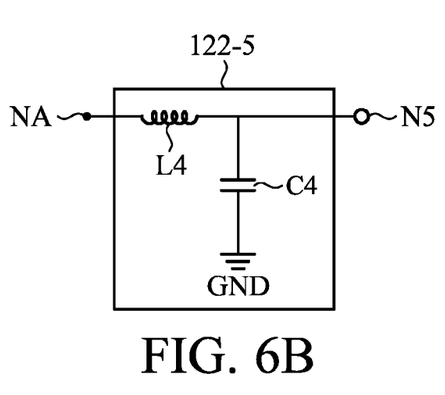
FIG. 6B is a diagram for illustrating a branch circuit according to another embodiment of the invention.

FIG. 6B is a diagram for illustrating the branch circuit 122-5 according to another embodiment of the invention. As shown in FIG. 6B, the branch circuit 122-5 comprises a capacitor C4 and an inductor L4. A first terminal of the inductor L4 is coupled to the antenna 110, and a second terminal of the inductor L4 is coupled to the switch node N5. A first terminal of the capacitor C4 is coupled to the second terminal of the inductor L4, and a second terminal of the capacitor C4 is coupled to the ground node GND.

The internal components of the branch circuits 122-1, 122-2, 122-3, 122-4, and 122-5 are just exemplary. The invention is not limited to the above. A designer can change the internal components of the branch circuits according to different requirements.

Figure 7:
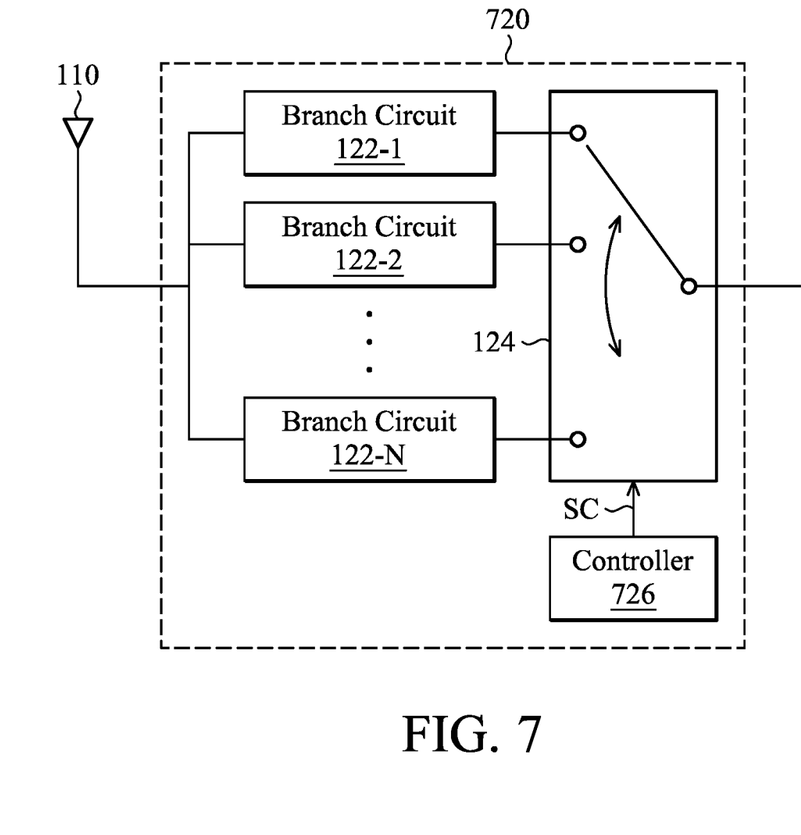
FIG. 7 is a diagram for illustrating an impedance adjustment device according to another embodiment of the invention.

FIG. 7 is a diagram for illustrating an impedance adjustment device 720 according to another embodiment of the invention. FIG. 7 is similar to FIG. 2. The difference from the embodiment of FIG. 2 is that the impedance adjustment device 720 further comprises a built-in controller 726. Similarly, the switch module 124 selects one of a plurality of branch circuits 122-1, 122-2, . . . , and 122-N as a transmission branch according to a control signal SC. In the embodiment, the controller 726 is integrated with the impedance adjustment device 720, and is configured to generate the control signal SC. More particularly, the control signal SC is generated according to comparisons between the RSSI values corresponding to the branch circuits 122-1, 122-2, . . . , and 122-N. For example, the control signal SC indicates at least one specific branch circuit corresponding to the highest RSSI value among the branch circuits 122-1, 122-2, . . . , and 122-N, and the switch module 124 selects the specific branch circuit as the transmission branch according to the control signal SC. The comparisons may be performed by the built-in controller 726 or by a processor which is independent of the impedance adjustment device 720. In some embodiments, the controller 726 receives the RSSI values from other components (not shown) and compares the RSSI values with each other to generate the control signal SC. It is noted that every detailed feature of the embodiments of FIGS. 1-6 may apply to the impedance adjustment device 720 of FIG. 7.

Figure 8:
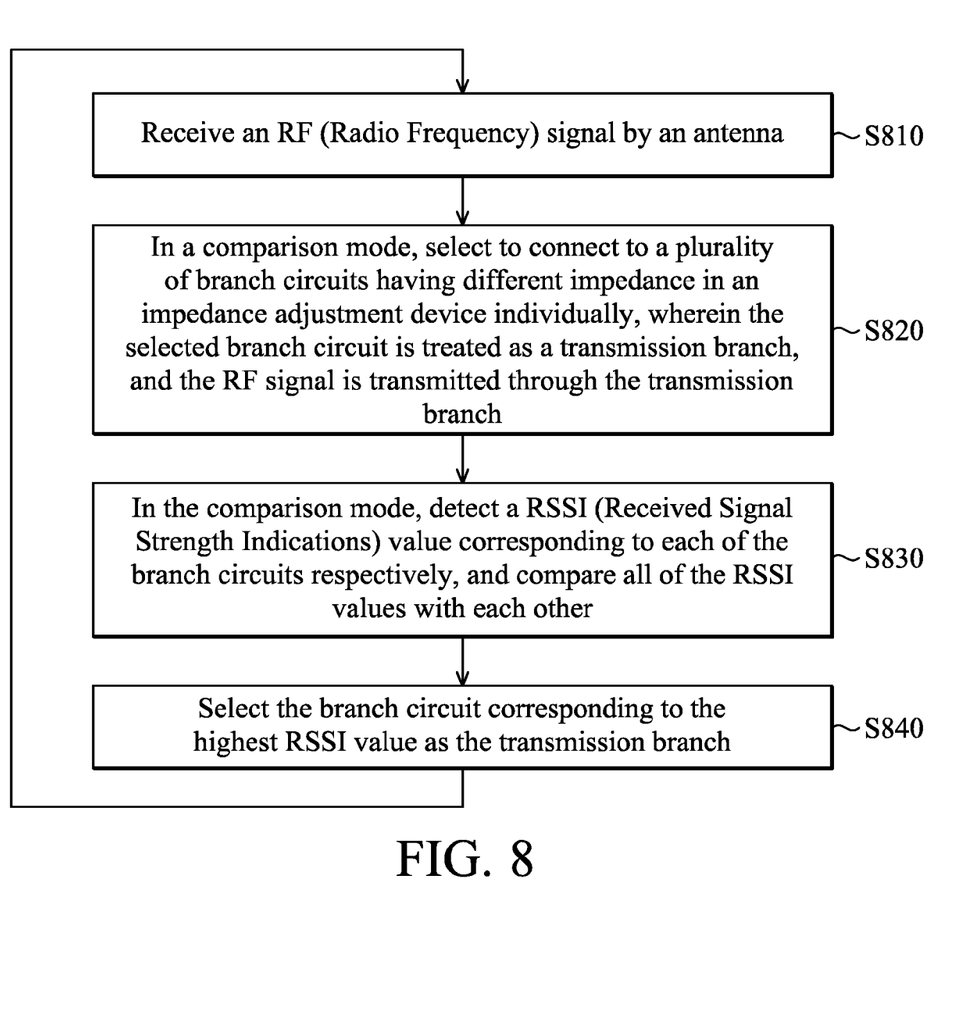
FIG. 8 is a flowchart for illustrating a method for impedance adjustment according to an embodiment of the invention.

FIG. 8 is a flowchart for illustrating a method for impedance adjustment according to an embodiment of the invention. To begin, in step S810, an RF (Radio Frequency) signal is received by an antenna. In step S820, in a comparison mode, a plurality of branch circuits of an impedance adjustment device are selected one after another, wherein the branch circuits have different impedance values, and the selected branch circuit is used as a transmission branch, and the RF signal is transmitted through the transmission branch. In some embodiments, a specific branch circuit having a short-circuited path is selected first. In step S830, in the comparison mode, the RSSI (Received Signal Strength Indications) value corresponding to each branch circuits are detected respectively, and all of the RSSI values are compared with each other. In step S840, the branch circuit corresponding to the highest RSSI value is finally selected as the transmission branch. In some embodiment, the steps S810-S840 are periodically performed in regular intervals such as a predetermined time (e.g., 10 ms). Note that every detailed feature of the embodiments of FIGS. 1-6 may be applied to the method for impedance adjustment of FIG. 8.

The transceiver, the impedance adjustment device, and the method for impedance adjustment in the invention at least have the following advantages: (1) when the impedance of the antenna is changed, an appropriate impedance path is selected to improve the communication quality; (2) by performing the selection, the power consumption of the whole system is reduced; and (3) by performing the selection, the adaption to variations of the antenna due to different manufacturing processes may be accomplished to provide an optimal impedance characteristic for the antenna.

The method of the invention, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having the certain name from another element having the same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transceiver, comprising:
   an antenna, receiving an RF (Radio Frequency) signal;
   an impedance adjustment device, coupled to the antenna, and comprising:
   a plurality of branch circuits, each of the branch circuits having different impedance values; and
   a switch module, selecting one of the branch circuits as a transmission branch according to a control signal;
   an RF front-end circuit, receiving the RF signal from the antenna through the transmission branch, and filtering and amplifying the RF signal;
   a storage device; and
   a processor, coupled to the RF front-end circuit, and generating the control signal,
   wherein the switch module selectively connects to each of the branch circuits individually, the processor detects a RSSI (Received Signal Strength Indication) value corresponding to each of the branch circuits respectively, records all of the RSSI values in the storage device, and compares the RSSI values in a comparison mode, and
   wherein the switch module selects the branch circuit corresponding to the highest RSSI value as the transmission branch.

2. The transceiver as claimed in claim 1, wherein the branch circuits comprises:
   a first branch circuit, being a short-circuit path;
   a second branch circuit, characterized by high admittance;
   a third branch circuit, characterized by inductance;
   a fourth branch circuit, characterized by capacitance; and
   a fifth branch circuit, characterized by high impedance.

3. The transceiver as claimed in claim 2, wherein the second branch circuit comprises a capacitor and an inductor, wherein a first terminal of the capacitor is coupled to the antenna, a second terminal of the capacitor is coupled to a switch node, a first terminal of the inductor is coupled to the first terminal of the capacitor, and a second terminal of the inductor is coupled to a ground node.

4. The transceiver as claimed in claim 2, wherein the second branch circuit comprises a capacitor and an inductor, wherein a first terminal of the inductor is coupled to the antenna, a second terminal of the inductor is coupled to a switch node, a first terminal of the capacitor is coupled to the first terminal of the inductor, and a second terminal of the capacitor is coupled to a ground node.

5. The transceiver as claimed in claim 2, wherein the third branch circuit comprises a first inductor and a second inductor, wherein a first terminal of the first inductor is coupled to the antenna, a second terminal of the first inductor is coupled to a switch node, a first terminal of the second inductor is coupled to the second terminal of the first inductor, and a second terminal of the second inductor is coupled to a ground node.

6. The transceiver as claimed in claim 2, wherein the third branch circuit comprises a first inductor and a second inductor, wherein a first terminal of the first inductor is coupled to the antenna, a second terminal of the first inductor is coupled to a switch node, a first terminal of the second inductor is coupled to the first terminal of the first inductor, and a second terminal of the second inductor is coupled to a ground node.

7. The transceiver as claimed in claim 2, wherein the fourth branch circuit comprises a first capacitor and a second capacitor, wherein a first terminal of the first capacitor is coupled to the antenna, a second terminal of the first capacitor is coupled to a switch node, a first terminal of the second capacitor is coupled to the second terminal of the first capacitor, and a second terminal of the second capacitor is coupled to a ground node.

8. The transceiver as claimed in claim 2, wherein the fourth branch circuit comprises a capacitor and a resistor, wherein a first terminal of the resistor is coupled to the antenna, a second terminal of the resistor is coupled to a first terminal of the capacitor, and a second terminal of the capacitor is coupled to a switch node.

9. The transceiver as claimed in claim 2, wherein the fifth branch circuit comprises a capacitor and an inductor, wherein a first terminal of the capacitor is coupled to the antenna, a second terminal of the capacitor is coupled to a switch node, a first terminal of the inductor is coupled to the second terminal of the capacitor, and a second terminal of the inductor is coupled to a ground node.

10. The transceiver as claimed in claim 2, wherein the fifth branch circuit comprises a capacitor and an inductor, wherein a first terminal of the inductor is coupled to the antenna, a second terminal of the inductor is coupled to a switch node, a first terminal of the capacitor is coupled to the second terminal of the inductor, and a second terminal of the capacitor is coupled to a ground node.

11. An impedance adjustment device, comprising:
    a plurality of branch circuits, each of the branch circuits having different impedance values; and
    a switch module, selecting one of the branch circuits as a transmission branch according to a control signal,
    wherein the control signal is generated according to comparisons between RSSI (Received Signal Strength Indications) values corresponding to the branch circuits, and
    wherein the control signal indicates at least one specific branch circuit corresponding to the highest RSSI value among the branch circuits, and the switch module selects the specific branch circuit as the transmission branch according to the control signal.

12. The impedance adjustment device as claimed in claim 11, further comprising: a controller, generating the control signal.

13. The impedance adjustment device as claimed in claim 11, wherein the branch circuits comprises: a first branch circuit, being a short-circuit path; a second branch circuit, characterized by high admittance; a third branch circuit, characterized by inductance; a fourth branch circuit, characterized by capacitance; and a fifth branch circuit, characterized by high impedance.

14. A method for impedance adjustment, comprising the steps of:
    (a) receiving an RF (Radio Frequency) signal by an antenna;
    (b) in a comparison mode, selecting to connect to a plurality of branch circuits having different impedance in an impedance adjustment device individually, wherein the selected branch circuit is treated as a transmission branch, and the RF signal is transmitted through the transmission branch;
    (c) in the comparison mode, detecting a RSSI (Received Signal Strength Indications) value corresponding to each of the branch circuits respectively, and comparing all of the RSSI values with each other; and
    (d) selecting the branch circuit corresponding to the highest RSSI value as the transmission branch.

15. The method as claimed in claim 14, wherein before the step (a) is performed, the method further comprises: selecting the branch circuit being short-circuit as the transmission branch.

16. The method as claimed in claim 14, wherein the steps (a)-(d) are performed at a regular intervals.

* * * * *